US007671779B1

(12) United States Patent
Guidry, Jr. et al.

(10) Patent No.: US 7,671,779 B1
(45) Date of Patent: Mar. 2, 2010

(54) SYSTEM AND METHOD FOR REDUCING POWER CONSUMPTION IN A MULTI-CHANNEL SIGNAL PROCESSOR

(75) Inventors: Michael J. Guidry, Jr., Manchester, NH (US); Jianguo Yao, Londonderry, NH (US); Matthew L. Courcy, Fremont, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 330 days.

(21) Appl. No.: 11/799,977

(22) Filed: May 3, 2007

(51) Int. Cl.
*H03M 1/12* (2006.01)

(52) U.S. Cl. ........................ 341/172; 341/155; 341/156

(58) Field of Classification Search ................. 341/155, 341/156, 159, 161, 172; 345/94
See application file for complete search history.

(56) References Cited

U.S. PATENT DOCUMENTS 5,041,823 A * 8/1991 Johnson et al. ............... 345/94
7,075,471 B1 * 7/2006 Gupta ........................ 341/155

OTHER PUBLICATIONS

"40MSPS 16-bit CCD Digitiser", Wolfson Microelectronics, Mar. 2004, 36 pages.

* cited by examiner

*Primary Examiner*—Jean B Jeanglaude

(57) ABSTRACT

An analog front end for a multi-channel signal processor is provided. The analog front end includes a first stage that is operable to receive a plurality of channel inputs. The first stage includes a ping/pong capacitor array corresponding to each of the channel inputs and an operational amplifier that may be coupled successively to each of the ping/pong capacitor arrays.

20 Claims, 6 Drawing Sheets

110
165
PING/PONG CAP ARRAY
PING/PONG CAP ARRAY
PING/PONG CAP ARRAY
CAPACITOR ARRAY
CAPACITOR ARRAY
CAPACITOR ARRAY
$150^1$
$150^1$
$150^N$
215
220
225
210
205
255
260
265
250
245
270
130c
155
AMP
AMP
CDS 130a
PGA 130b
ANALOG-TO-DIGITAI CONVERTER
$160^1$
$160^2$
$160^3$

SYSTEM AND METHOD FOR REDUCING POWER CONSUMPTION IN A MULTI-CHANNEL SIGNAL PROCESSOR

TECHNICAL FIELD

This disclosure is generally directed to signal processing and, more specifically, to a system and method for reducing power consumption in a multi-channel signal processor.

BACKGROUND

Signal processors, such as image signal processors, typically employ an analog front end (AFE) to convert analog sensor information into digital code, which may then be manipulated by a digital signal processor. In some conventional AFEs, the sensor information is sampled by a correlated double sampler (CDS). To account for differences in channel gains, the output of the CDS is generally passed to a programmable gain amplifier (PGA) that can provide independent signal gain or attenuation to each channel. The resulting signal may then be provided to an analog-to-digital converter (ADC) for conversion into a digital signal.

The most common sensors for image signal processors produce signals for three colors: red, green and blue. Therefore, the AFE for such a system has to be able to process three colors simultaneously. To accomplish this in a conventional AFE, three completely separate analog channels, each with a CDS, a PGA and an ADC, are implemented in the AFE. If there are additional sensor outputs (e.g., even and odd for each color), the total number of CDS, PGA and ADC blocks increases proportionally. Each CDS block and each PGA block has an operational amplifier that consumes power even when the operational amplifier is not being used (e.g., when the block is sampling input signals). Therefore, as the number of these blocks increases, both the power being used for amplification and the power being wasted when no signals are being amplified also increases. In addition, as the number of ADC blocks increases, the amount of power consumed and the area requirements for the AFE increase as well.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior as well as future uses of such defined words and phrases.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged signal processor.

Figure 1:
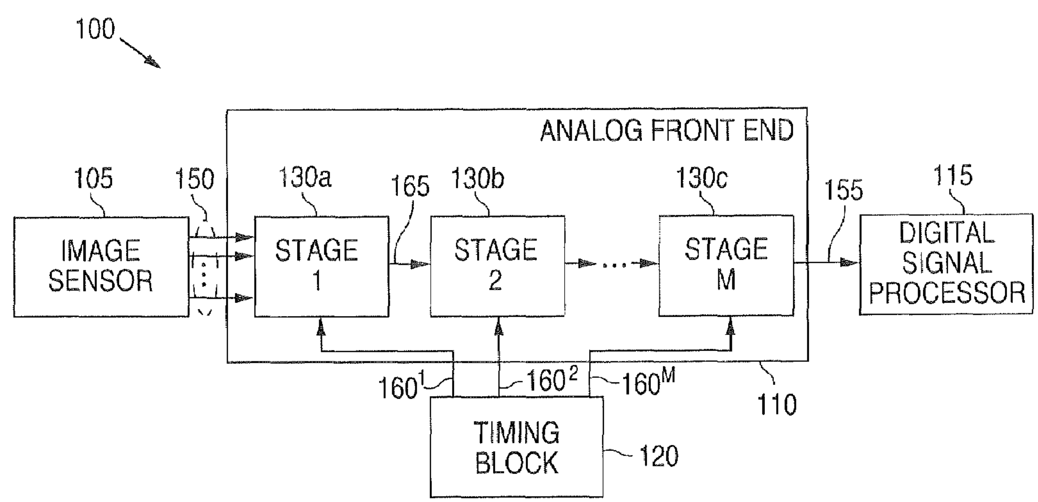
FIG. 1 illustrates a multi-channel image signal processor with reduced power consumption according to one embodiment of this disclosure.

FIG. 1 illustrates a multi-channel image signal processor 100 with reduced power consumption according to one embodiment of this disclosure. The multi-channel image signal processor 100 may be implemented as part of a multi-function peripheral, facsimile equipment, a flatbed or handheld color scanner, a high-speed document scanner, or any other suitable imaging application.

The multi-channel image signal processor 100 comprises an image sensor 105, an analog front end 110, a digital signal processor 115, and a timing block 120. It will be understood that the multi-channel image signal processor 100 may comprise any other suitable components not illustrated in FIG. 1 without departing from the scope of this disclosure.

The image sensor 105 may comprise a charge-coupled device (CCD), a CMOS image sensor (CIS), or other suitable sensor operable to capture image information. The analog front end 110 is coupled to the image sensor 105 and is operable to receive an analog channel input 150 for each of a plurality of channels from the image sensor 105 and to convert the channel inputs 150 into digital outputs 155. For one embodiment, the number of channels, N, and thus the number of channel inputs 150 may comprise three, with each channel corresponding to a particular color (e.g., red, green and blue). However, it will be understood that the image sensor 105 may be operable to generate any suitable number of channel inputs 150 without departing from the scope of this disclosure.

The digital signal processor 115 is coupled to the analog front end 110 and is operable to receive the digital outputs 155 and to provide further image processing for the images included in the digital outputs 155. The timing block 120 is coupled to the analog front end 110 and is operable to generate timing waveforms 160 for use by the analog front end 110 in processing the channel inputs 150.

The analog front end 110 comprises a plurality of stages 130. For one particular embodiment described in more detail below in connection with FIGS. 2 and 3, the analog front end 110 may comprise three stages, with the first stage 130*a* comprising a correlated double sampler, the second stage 130*b* comprising a programmable gain amplifier, and the third stage 130*c* comprising an analog-to-digital converter 140. However, it will be understood that the analog front end 110 may comprise any suitable number of stages 130. Each stage 130 is operable to receive a corresponding timing waveform 160 from the timing block 120.

The first stage 130*a* is operable to receive the channel inputs 150 from the image sensor 105 and the timing waveform $\mathbf{160}_1$ from the timing block 120. The first stage 130*a* is also operable to generate a time-interleaved signal 165 for the second stage 130*b*.

For one embodiment, the first stage 130*a* comprises a ping/pong capacitor array for each channel input 150 and a single operational amplifier. As used herein, a "ping/pong capacitor array" means a pair of essentially identical capacitor arrays, each of which is operable to sample a channel input 150 for a same channel at different times. Thus, a first capacitor array in each pair of capacitor arrays may be operable to sample the channel input 150 at some point during a first cycle and to hold the channel input 150 for amplification by the operational amplifier at some point during a second cycle. Similarly, a second capacitor array in each pair of capacitor arrays may be operable to hold the channel input 150 for amplification by the operational amplifier at some point during the first cycle and to sample the channel input 150 at some point during the second cycle.

Thus, based on the timing waveform $\mathbf{160}_1$ provided by the timing block 120, the operational amplifier may be shared by the ping/pong capacitor arrays. In this way, only a single operational amplifier is needed, thereby reducing power consumption as compared to an analog front end that implements an operational amplifier for each channel input from an image sensor. For example, when a single operational amplifier is used, the power consumed may be reduced from an original power, P, to a reduced power of approximately (1/N)×P.

In addition, the timing waveform $\mathbf{160}_1$ may be generated in such a way as to allow the operational amplifier to function substantially continuously, resulting in the elimination of wasted power consumed by an operational amplifier not being used. As used herein, "substantially continuously" means that the operational amplifier is scheduled to amplify a series of inputs one after another without any scheduled interruptions. Also, any stages 130 subsequent to the first stage 130*a* that use operational amplifiers may take advantage of the timing split of the channel inputs 150 performed by the first stage 130*a* in generating the time-interleaved signal 165 by implementing a single operational amplifier that may be shared by other components in the stage 130. Accordingly, both the power consumption and area in those stages 130 may also be reduced.

Figure 2:
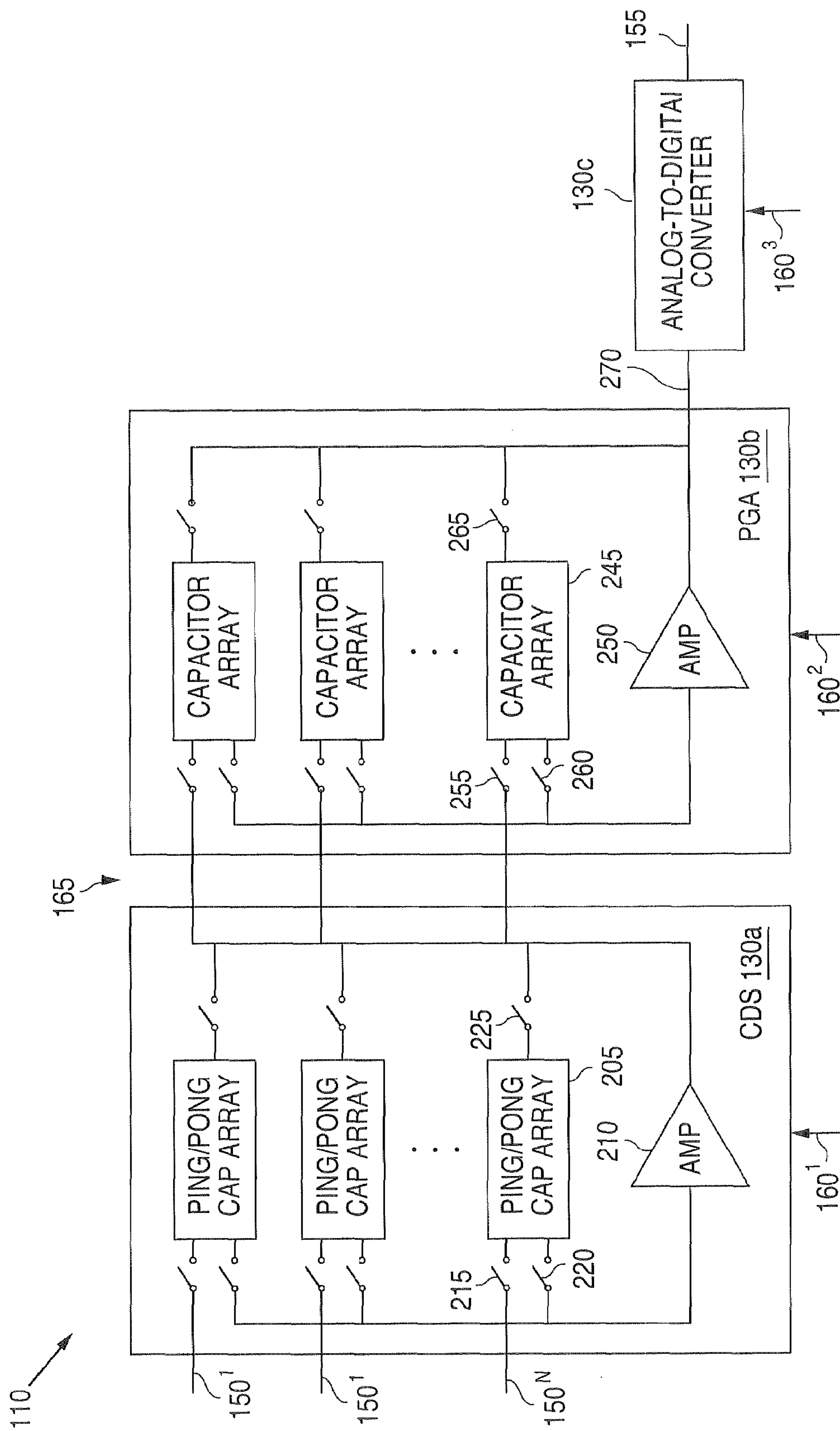
FIG. 2 illustrates details of the analog front end of FIG. 1 according to one embodiment of this disclosure.

FIG. 2 illustrates details of the analog front end 110 according to one embodiment of this disclosure. For this embodiment, the analog front end 110 comprises three stages 130:

a correlated double sampler (CDS) 130*a*, a programmable gain amplifier (PGA) 130*b*, and an analog-to-digital converter 130*c*. However, as described above in connection with FIG. 1, the analog front end 110 may comprise additional stages 130 and/or other types of stages 130 without departing from the scope of this disclosure. In addition, although described as implemented in an image signal processor, such as the multi-channel image signal processor 100, it will be understood that the analog front end 110 may be implemented in any suitable multi-channel signal processor without departing from the scope of this disclosure.

As the first stage, the CDS 130*a* is operable to receive the channel inputs $\mathbf{150}_{1\text{-}N}$ and the timing waveform $\mathbf{160}_1$ and to generate the time-interleaved signal 165 based on those inputs $\mathbf{150}_{1\text{-}N}$ and $\mathbf{160}_1$. The CDS 130*a* may be operable to double-sample channel inputs 150 that contain both reset and signal levels and to single-sample channel inputs 150 that contain only signal levels.

For this embodiment, the CDS 130*a* comprises a plurality of ping/pong capacitor arrays 205 and a single operational amplifier 210. Based on the timing waveform $\mathbf{160}_1$, each ping/pong capacitor array 205 is operable to sample a corresponding channel input 150 from the image sensor 105 when a channel input switch 215 for the array 205 is closed. In addition, based on the timing waveform $\mathbf{160}_1$, each ping/pong capacitor array 205 is operable to be coupled to an input of the operational amplifier 210 when an amplifier input switch 220 is closed and to an output of the operational amplifier 210 when an amplifier output switch 225 is closed in order to allow a sampled input to be amplified to generate the time-interleaved signal 165. In this way, the operational amplifier 210 may be coupled successively to each of the ping/pong capacitor arrays 205, allowing the CDS 130*a* to function using a single operational amplifier 210.

As described in more detail below in connection with FIG. 4, each ping/pong capacitor array 205 comprises a pair of capacitor arrays called a ping capacitor array and a pong capacitor array. During a ping hold cycle as defined by the timing waveform $\mathbf{160}_1$, each of the ping capacitor arrays is allocated a time slot to hold (i.e., to use the operational amplifier 210 to amplify the corresponding channel input 150 and to generate the time-interleaved signal 165). Also during the ping hold cycle, each of the pong capacitor arrays is allocated a time slot to sample the corresponding channel input 150. Similarly, during a pong hold cycle, each of the pong capacitor arrays is allocated a time slot to hold and each of the ping capacitor arrays is allocated a time slot to sample.

The PGA 130*b* is coupled to the CDS 130*a* and is operable to receive the time-interleaved signal 165 and to generate an amplified signal 270 based on the time-interleaved signal 165 in such a manner as to provide independent signal gain or attenuation to each channel. For this embodiment, the PGA 130*b* comprises a plurality of capacitor arrays 245 and a single operational amplifier 250. Based on the timing waveform $\mathbf{160}_2$, each capacitor array 245 is operable to sample the time-interleaved signal 165 from the CDS 130*a* when a CDS input switch 255 for the array 245 is closed. In addition, based on the timing waveform $\mathbf{160}_2$, each capacitor array 245 is operable to be coupled to an input of the operational amplifier 250 when an amplifier input switch 260 is closed and to an output of the operational amplifier 250 when an amplifier output switch 265 is closed in order to allow a sampled input to be amplified to generate the amplified signal 270. In this way, the operational amplifier 250 may be coupled successively to each of the capacitor arrays 245, allowing the PGA 130*b* to function using a single operational amplifier 250.

In addition, because the input to the PGA 130*b* is a time-interleaved signal 165, a single operational amplifier 250 may be used in the PGA 130*b* without the need for additional capacitor arrays for each channel. Thus, using a single operational amplifier 250 in the PGA 130*b* allows both power consumption and area requirements to be reduced as compared to analog front ends that use multiple operational amplifiers in a PGA.

The analog-to-digital converter (ADC) 130*c* is coupled to the PGA 130*b*. The ADC 130*c* is operable to receive the amplified signal 270 and the timing waveform $\mathbf{160}_3$ and to generate digital outputs 155 for the analog front end 110 based on those inputs 270 and $\mathbf{160}_3$. For example, based on a sampling clock rate provided by the timing waveform $\mathbf{160}_3$, the ADC 130*c* may convert an analog amplified signal 270 into a digital output 155. As described in more detail below in connection with FIG. 3, the ADC 130*c* may be operable to function at a clock rate that is N times faster than the capacitor arrays 245 of the PGA 130*b*. Thus, for an embodiment in which the image sensor 105 is operable to generate three channel inputs 150, the ADC 130*c* may be operable to function at three times the rate of the capacitor arrays 245 of the PGA 130*b*. This allows a single ADC 130*c* to be implemented in the analog front end 110, which further reduces power consumption and area requirements as compared to analog front ends having an ADC for each independently processed channel.

Figure 3:
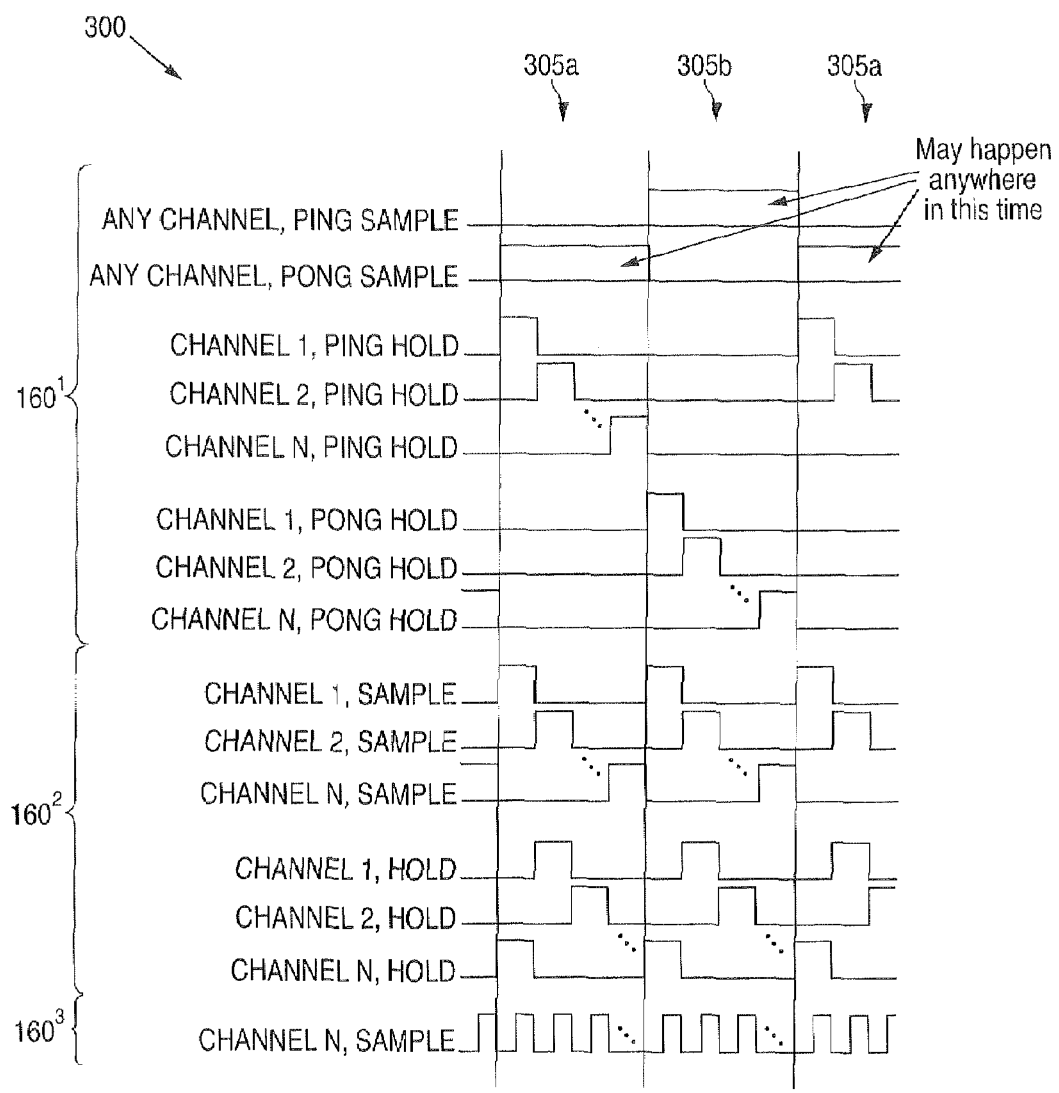
FIG. 3 illustrates an example of a timing diagram that may be generated by the timing block of FIG. 1 according to one embodiment of this disclosure.

FIG. 3 illustrates an example of a timing diagram 300 that may be generated by the timing block 120 according to one embodiment of this disclosure. For the illustrated embodiment of the timing diagram 300, the analog front end 110 is assumed to comprise a CDS 130*a*, a PGA 130*b*, and an ADC 130*c*, as described above in connection with FIG. 2. However, as described above, the analog front end 110 may comprise other or additional stages 130 without departing from the scope of this disclosure. In addition, although described as implemented in an image signal processor, such as the multi-channel image signal processor 100, it will be understood that the timing block 120 may be implemented in any suitable multi-channel signal processor without departing from the scope of this disclosure.

The timing diagram 300 comprises a timing waveform $\mathbf{160}_1$ for the CDS 130*a*, a timing waveform $\mathbf{160}_2$ for the PGA 130*b*, and a timing waveform $\mathbf{160}_3$ for the ADC 130*c*. Each of the timing waveforms 160 may be generally divided into a plurality of ping hold cycles 305*a* and pong hold cycles 305*b*. Each of N ping/pong capacitor arrays 205 is operable to receive a channel input 150. Thus, for the embodiment in which the timing block 120 and the analog front end 110 are implemented in the multi-channel image signal processor 100, the multi-channel image signal processor 100 is operable to process N channels. However, for simplicity, only channels 1, 2 and N are shown in the timing diagram 300.

During each ping hold cycle 305*a*, each pong capacitor array in the ping/pong capacitor arrays 205 is allocated a time to sample a corresponding channel input 150 at any suitable time. In addition, each ping capacitor array in the ping/pong capacitor arrays 205 is allocated a time to hold a previously sampled channel input 150 for amplification by the operational amplifier 210. Although the illustrated timing waveform $\mathbf{160}_1$ shows the ping capacitor arrays being allocated hold times sequentially, it will be understood that the timing block 120 may arrange the hold times in any suitable order without departing from the scope of this disclosure.

Also, during each ping hold cycle 305*a*, the PGA 130*b* is allocated a time for each channel to sample the time-interleaved signal 165 that is being generated by the CDS 130*a*. Thus, while the ping capacitor array for Channel 1 is allocated a hold time by the timing waveform $\mathbf{160}_1$, the corresponding capacitor array 245 of the PGA 130*b* is allocated a sample time by the timing waveform $\mathbf{160}_2$. As a result, the PGA 130*b* is able to sample the portion of the time-interleaved signal 165 corresponding to Channel 1 during that sample time. Similarly, as each subsequent channel is held by the CDS 130*a*, the PGA 130*b* samples the same channel.

After the capacitor array 245 for a particular channel has sampled the time-interleaved signal 165 for that particular channel, the capacitor array 245 is allocated a hold time during which the sampled signal 165 is amplified by the operational amplifier 250 to generate the amplified signal 270. During this hold time, the ADC 130*c* is allocated a sample time to sample the amplified signal 270 in order to generate the digital output 155 for the particular channel. Thus, as illustrated in timing waveform $\mathbf{160}_3$, the ADC 130*c* in this embodiment converts N amplified signals 270 into digital outputs 155 during each cycle 305.

In a similar manner, during each pong hold cycle 305*b*, each ping capacitor array in the ping/pong capacitor arrays 205 is allocated a time to sample a corresponding channel input 150 at any suitable time. In addition, each pong capacitor array in the ping/pong capacitor arrays 205 is allocated a time to hold a previously sampled channel input 150 for amplification by the operational amplifier 210.

Also, during each pong hold cycle 305*b*, the PGA 130*b* and the ADC 130*c* both operate in the same manner as during a ping hold cycle 305*a*. Thus, the PGA 130*b* is allocated a time for each channel to sample the time-interleaved signal 165 that is being generated by the CDS 130*a*. While the pong capacitor array for each channel is allocated a hold time, the corresponding capacitor array 245 of the PGA 130*b* is allocated a sample time to sample the portion of the time-interleaved signal 165 corresponding to the channel. After the capacitor array 245 for a particular channel has sampled the time-interleaved signal 165 for that particular channel, the capacitor array 245 is allocated a hold time during which the sampled signal 165 is amplified by the operational amplifier 250 to generate the amplified signal 270. During this hold time, the ADC 130*c* is allocated a sample time to sample the amplified signal 270 in order to generate the digital output 155 for the particular channel.

Using this timing diagram 300, the channel inputs 150 may be sampled independently of each other while only a single operational amplifier 210 is implemented in the CDS 130*a* and only a single operational amplifier 250 is implemented in the PGA 130*b*. This is possible because each channel input 150 is allocated 1/N of the hold time during each cycle 305 for amplification. As a result, each channel input 150 is amplified at some point during the cycle 305.

The timing block 120 may generate alternate timing diagrams for various numbers of channels. For example, if the number of channel inputs 150, N, is originally three, the timing block 120 may generate a timing diagram comprising hold and sample times for three channels and may provide the resulting timing waveforms $\mathbf{160}_{1\text{-}M}$ to the stages 130 of the analog front end 110 for use in processing the channel inputs 150. At another time, if the number of channel inputs 150, N, is reduced to two, the timing block 120 may generate an alternate timing diagram comprising hold and sample times for two channels. The timing block 120 may then provide the resulting alternate timing waveforms $\mathbf{160}_{1\text{-}M}$ to the stages 130 of the analog front end 110 for use in processing the channel inputs 150. Thus, no additional switches or other circuitry needs to be implemented in order to allow the analog front end 110 to alternate between different channel modes (e.g., 1-, 2-, or 3-channel modes) in a same application.

Figure 4:
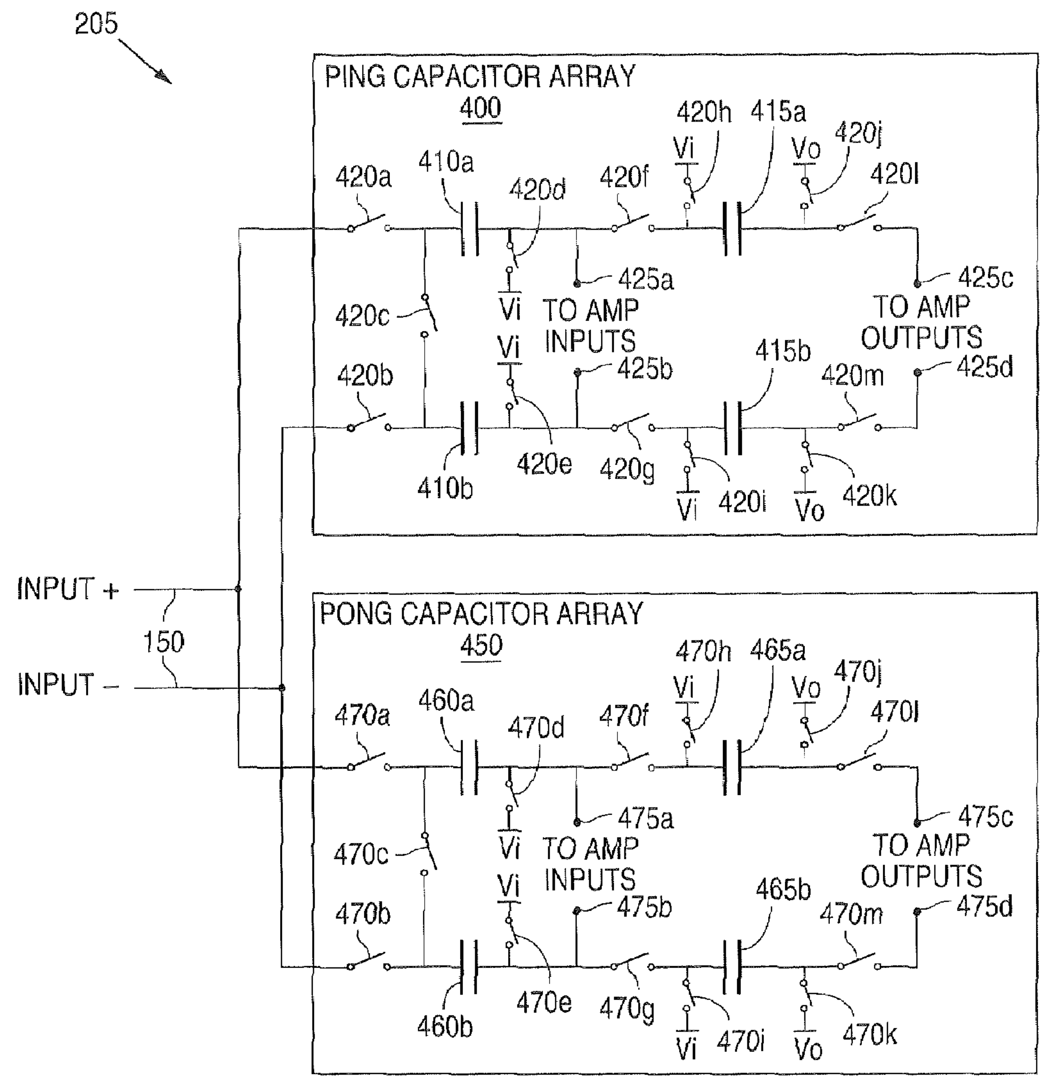
FIG. 4 illustrates details of one of the ping/pong capacitor arrays of FIG. 2 according to one embodiment of this disclosure.

FIG. 4 illustrates details of one of the ping/pong capacitor arrays 205 according to one embodiment of this disclosure. The ping/pong capacitor array 205 comprises a ping capacitor array 400 and a pong capacitor array 450. For this embodiment, the ping/pong capacitor array 205 is a differential capacitor array that is operable to receive a differential channel input 150, and the operational amplifier 210 (not illustrated in FIG. 4) is a differential amplifier.

The ping capacitor array 400 comprises a first pair of capacitors 410*a-b* and a second pair of capacitors 415*a-b*, in addition to a plurality of switches 420*a-m* and nodes 425*a-d*. The timing waveform $\mathbf{160}_1$ is operable to cause certain switches 420 to open and other switches 420 to close in order to place the ping capacitor array 400 in a hold configuration or a sample configuration, as described above in connection with FIG. 3.

Similarly, the pong capacitor array 450 comprises a first pair of capacitors 460*a-b* and a second pair of capacitors 465*a-b*, in addition to a plurality of switches 470*a-m* and nodes 475*a-d*. The timing waveform $\mathbf{160}_1$ is operable to cause certain switches 470 to open and other switches 470 to close in order to place the pong capacitor array 450 in a hold configuration or a sample configuration, as described above in connection with FIG. 3.

The switches 420*a-b* and 470*a-b* correspond to the channel input switch 215 and, thus, are operable to close when the corresponding capacitor array 400 or 450 is allocated a time slot for sampling the channel input 150. The nodes 425*a-b* and 475*a-b* are coupled to the amplifier input switch 220, and the nodes 425*c-d* and 475*c-d* are coupled to the amplifier output switch 225. The switches 420*d-e,h-i* and 470*d-e,h-i* are operable to provide a connection to a common mode input voltage (Vi), and the switches 420*j-k* and 470*j-k* are operable to provide a connection to a common mode output voltage (Vo).

Figure 5A:
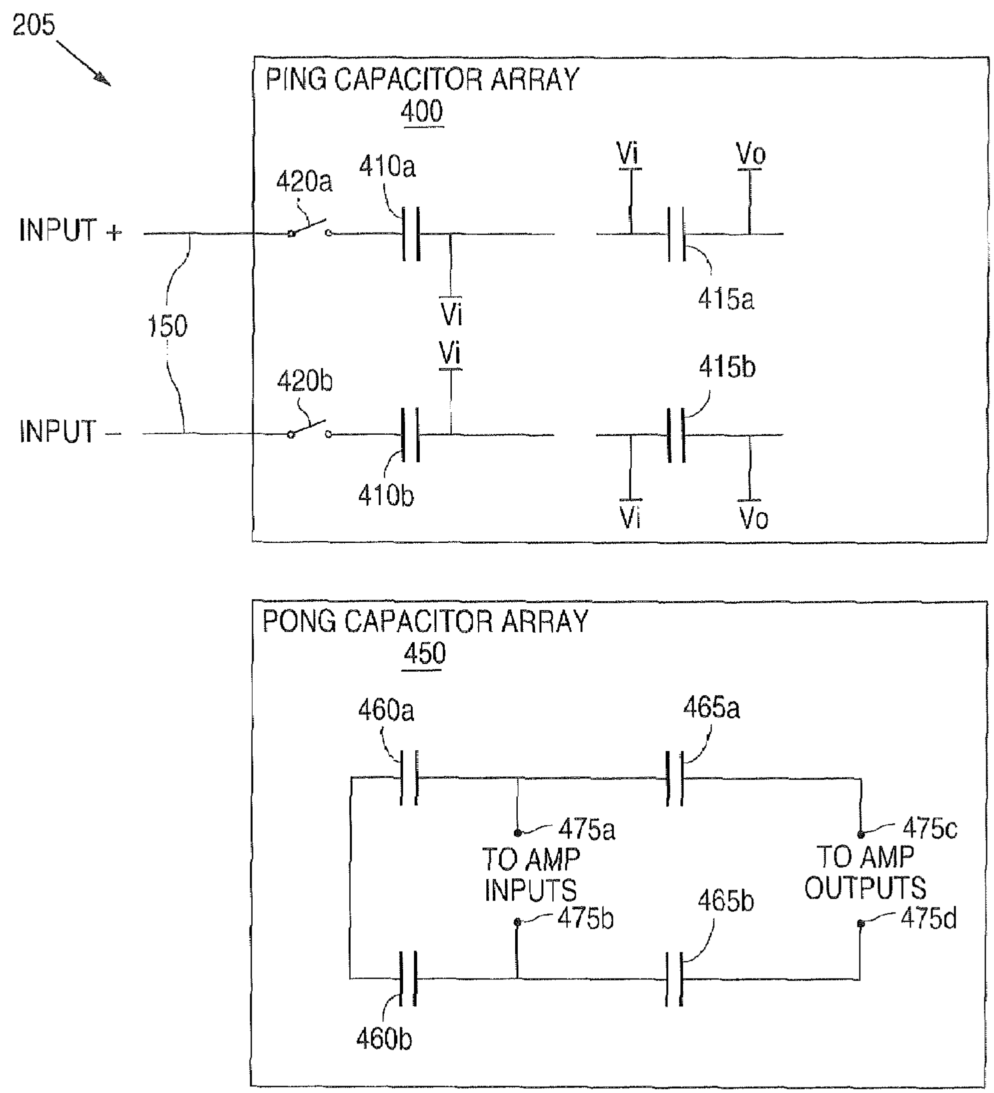
FIG. 5A illustrates the ping/pong capacitor array of FIG. 4 in a pong hold cycle according to one embodiment of this disclosure.

FIG. 5A illustrates the ping/pong capacitor array 205 in a pong hold cycle 305*b* according to one embodiment of this disclosure. For this embodiment, the ping/pong capacitor array 205 comprises the ping capacitor array 400 and the pong capacitor array 450 as illustrated in FIG. 4.

The ping capacitor array 400 is operable to sample the channel input 150 based on the timing waveform $\mathbf{160}_1$. Thus, when the timing waveform $\mathbf{160}_1$ allocates a sample time for the channel corresponding to this ping capacitor array 400, the switches 420*a-b* are closed and the channel input 150 is applied to the first pair of capacitors 410*a-b*, each of which is coupled to the common mode input voltage. At the same time, each capacitor 415*a-b* in the second pair is coupled between the common mode input voltage and the common mode output voltage.

The pong capacitor array 450 is operable to hold a previously sampled channel input 150 for amplification by the operational amplifier 210 based on the timing waveform $\mathbf{160}_1$. Thus, when the timing waveform $\mathbf{160}_1$ allocates a hold time for the channel corresponding to this pong capacitor array 450, the switches 220 and 225 (not illustrated in FIG. 5A) are closed. As a result, the nodes 475*a-b* are coupled to the input of the operational amplifier 210 and the nodes 475*c-d* are coupled to the output of the operational amplifier 210. At this point, the time-interleaved signal 165 being generated by the CDS 130*a* corresponds to the channel input 150 being held by the pong capacitor array 450 and amplified by the operational amplifier 210.

Figure 5B:
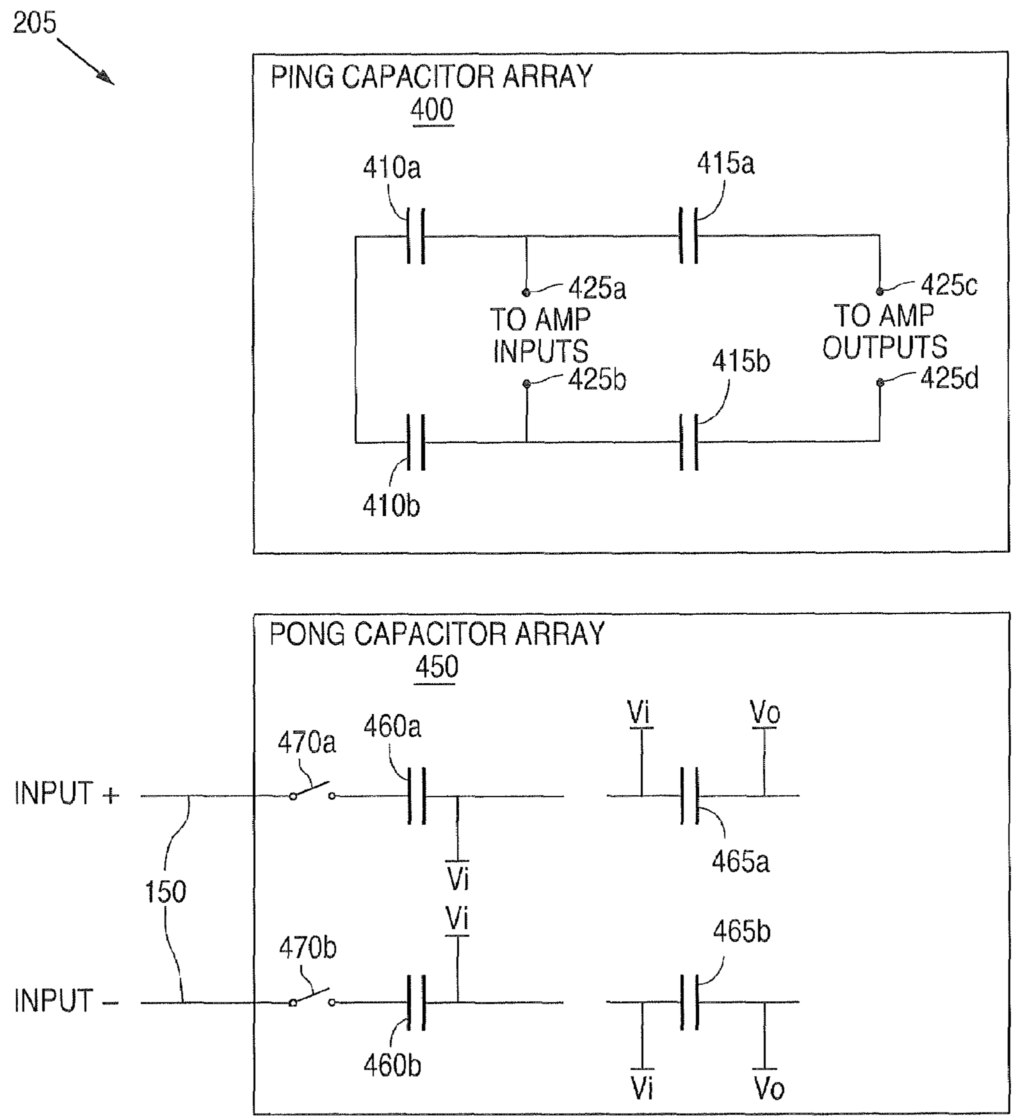
FIG. 5B illustrates the ping/pong capacitor array of FIG. 4 in a ping hold cycle according to one embodiment of this disclosure.

FIG. 5B illustrates the ping/pong capacitor array 205 in a ping hold cycle 305*a* according to one embodiment of this disclosure. For this embodiment, the ping/pong capacitor array 205 comprises the ping capacitor array 400 and the pong capacitor array 450 as illustrated in FIG. 4.

The pong capacitor array 450 is operable to sample the channel input 150 based on the timing waveform $\mathbf{160}_1$. Thus, when the timing waveform $\mathbf{160}_1$ allocates a sample time for the channel corresponding to this pong capacitor array 450, the switches 470*a-b* are closed and the channel input 150 is applied to the first pair of capacitors 460*a-b*, each of which is coupled to the common mode input voltage. At the same time, each capacitor 465*a-b* in the second pair is coupled between the common mode input voltage and the common mode output voltage.

The ping capacitor array 400 is operable to hold a previously sampled channel input 150 for amplification by the operational amplifier 210 based on the timing waveform $\mathbf{160}_1$. Thus, when the timing waveform $\mathbf{160}_1$ allocates a hold time for the channel corresponding to this ping capacitor array 400, the switches 220 and 225 (not illustrated in FIG. 5B) are closed. As a result, the nodes 425*a-b* are coupled to the input of the operational amplifier 210 and the nodes 425*c-d* are coupled to the output of the operational amplifier 210. At this point, the time-interleaved signal 165 being generated by the CDS 130*a* corresponds to the channel input 150 being held by the ping capacitor array 400 and amplified by the operational amplifier 210.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An analog front end for a multi-channel signal processor, the analog front end comprising a first stage operable to receive a plurality of channel inputs, the first stage comprising:

a plurality of ping/pong capacitor arrays each corresponding to one of the channel inputs; and an operational amplifier operable to be coupled successively to each ping/pong capacitor array.

2. The analog front end of claim 1, the operational amplifier operable to function substantially continuously.

3. The analog front end of claim 1, the first stage further operable to receive a first-stage timing waveform comprising a plurality of ping hold cycles and a plurality of pong hold cycles, each ping/pong capacitor array comprising a ping capacitor array and a pong capacitor array, the first-stage timing waveform operable to allocate a hold time for each ping capacitor array and a sample time for each pong capacitor array during each ping hold cycle and to allocate a sample time for each ping capacitor array and a hold time for each pong capacitor array during each pong hold cycle.

4. The analog front end of claim 1, the first stage further operable to generate a time-interleaved signal based on the channel inputs, the analog front end further comprising a second stage coupled to the first stage, the second stage operable to receive the time-interleaved signal and to generate an amplified signal based on the time-interleaved signal, the second stage comprising a plurality of second-stage capacitor arrays and a second-stage operational amplifier operable to be coupled successively to each of the second-stage capacitor arrays.

5. The analog front end of claim 1, further comprising:

a second stage coupled to the first stage; and a third stage coupled to the second stage, the first stage comprising a correlated double sampler (CDS), the second stage comprising a programmable gain amplifier (PGA), and the third stage comprising an analog-to-digital converter (ADC).

6. The analog front end of claim 5, the first stage further operable to receive a first-stage timing waveform and to generate a time-interleaved signal based on the channel inputs and the first-stage timing waveform, the second stage operable to receive the time-interleaved signal and a second-stage timing waveform and to generate an amplified signal based on the time-interleaved signal and the second-stage timing waveform, and the third stage operable to receive the amplified signal and a third-stage timing waveform and to generate a digital output signal based on the amplified signal and the third-stage timing waveform.

7. The analog front end of claim 6, the third stage operable to sample the amplified signal at a rate based on a number of channel inputs.

8. A multi-channel signal processor, comprising:

an analog front end comprising a first stage, the first stage comprising a plurality of ping/pong capacitor arrays and an operational amplifier operable to be coupled successively to each of the ping/pong capacitor arrays; and a timing block coupled to the analog front end, the timing block operable to generate a first-stage timing waveform, the first stage operable to function based on the first-stage timing waveform.

9. The multi-channel signal processor of claim 8, the operational amplifier operable to function substantially continuously.

10. The multi-channel signal processor of claim 8, each ping/pong capacitor array comprising a ping capacitor array and a pong capacitor array, the first-stage timing waveform operable to allocate a hold time for each ping capacitor array and a sample time for each pong capacitor array during each of a plurality of ping hold cycles and to allocate a sample time for each ping capacitor array and a hold time for each pong capacitor array during each of a plurality of pong hold cycles.

11. The multi-channel signal processor of claim 8, each of the ping/pong capacitor arrays operable to receive a corresponding channel input, the first stage further operable to generate a time-interleaved signal based on the channel inputs and the first-stage timing waveform.

12. The multi-channel signal processor of claim 11, the analog front end further comprising a second stage coupled to the first stage, the second stage comprising a plurality of second-stage capacitor arrays and a second-stage operational amplifier operable to be coupled successively to each of the second-stage capacitor arrays, and the timing block further operable to generate a second-stage timing waveform, the second stage operable to function based on the second-stage timing waveform.

13. The multi-channel signal processor of claim 12, the second stage further operable to receive the time-interleaved signal and to generate an amplified signal based on the time-interleaved signal and the second-stage timing waveform.

14. The multi-channel signal processor of claim 13, the analog front end further comprising a third stage coupled to the second stage, the first stage comprising a correlated double sampler (CDS), the second stage comprising a programmable gain amplifier (PGA), and the third stage comprising an analog-to-digital converter (ADC).

15. The multi-channel signal processor of claim 14, the timing block further operable to generate a third-stage timing waveform, the third stage operable to receive the amplified signal and the third-stage timing waveform and to generate a digital output signal based on the amplified signal and the third-stage timing waveform.

16. The multi-channel signal processor of claim 15, the third stage operable to sample the amplified signal at a rate based on a number of channel inputs.

17. A method for reducing power consumption in a multi-channel signal processor, comprising:

receiving a channel input for each of a plurality of channels at a corresponding ping/pong capacitor array;

receiving a first-stage timing waveform; and based on the first-stage timing waveform, coupling a single first-stage operational amplifier to each of the ping/pong capacitor arrays in succession to generate a time-interleaved signal based on the channel inputs.

18. The method of claim 17, the first-stage timing waveform comprising a plurality of ping hold cycles and a plurality of pong hold cycles, each ping/pong capacitor array comprising a ping capacitor array and a pong capacitor array, the first-stage timing waveform operable to allocate a hold time for each ping capacitor array and a sample time for each pong capacitor array during each ping hold cycle and to allocate a sample time for each ping capacitor array and a hold time for each pong capacitor array during each pong hold cycle.

19. The method of claim 17, further comprising:

receiving the time-interleaved signal at each of a plurality of second-stage capacitor arrays;

receiving a second-stage timing waveform; and based on the second-stage timing waveform, coupling a single second-stage operational amplifier to each of the second-stage capacitor arrays in succession to generate an amplified signal based on the time-interleaved signal.

20. The method of claim 19, further comprising sampling the amplified signal at a rate based on a number of channel inputs using a single analog-to-digital converter (ADC) to convert the amplified signal into a digital output signal.

* * * * *